(12) United States Patent
Kim et al.

(10) Patent No.: US 10,079,144 B2
(45) Date of Patent: Sep. 18, 2018

(54) COMPOSITION FOR LAYERED TRANSITION METAL CHALCOGENIDE COMPOUND LAYER AND METHOD OF FORMING LAYERED TRANSITION METAL CHALCOGENIDE COMPOUND LAYER

(71) Applicant: Samsung Electronics Co., Ltd., Suwon-si, Gyeonggi-do (KR)

(72) Inventors: Haeryong Kim, Seongnam-si (KR); Hyeonjin Shin, Suwon-si (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 64 days.

(21) Appl. No.: 15/134,693

(22) Filed: Apr. 21, 2016

(65) Prior Publication Data
US 2016/0314968 A1 Oct. 27, 2016

Related U.S. Application Data
(60) Provisional application No. 62/151,012, filed on Apr. 22, 2015.

(30) Foreign Application Priority Data
May 8, 2015 (KR) .................. 10-2015-0064899

(51) Int. Cl.
| | | |
|---|---|---|
| C01B 17/00 | (2006.01) | |
| H01L 21/02 | (2006.01) | |
| C23C 16/56 | (2006.01) | |
| C09D 1/00 | (2006.01) | |
| H01L 29/423 | (2006.01) | |
| C23C 16/30 | (2006.01) | |
| H01L 29/786 | (2006.01) | |

(52) U.S. Cl.
CPC .......... *H01L 21/02568* (2013.01); *C09D 1/00* (2013.01); *C23C 16/305* (2013.01); *C23C 16/56* (2013.01); *H01L 21/0262* (2013.01); *H01L 29/42356* (2013.01); *H01L 29/78681* (2013.01); *H01L 21/02664* (2013.01)

(58) Field of Classification Search
CPC .......... C01B 17/00; C01B 19/04; C09D 1/00; C23C 16/305; C23C 16/56; H01L 21/02568; H01L 21/0262; H01L 21/02664; H01L 21/28518; H01L 21/28556; H01L 21/28568; H01L 29/42356; H01L 29/66969; H01L 29/786
USPC ........................ 252/519.14, 519.4
See application file for complete search history.

(56) References Cited

U.S. PATENT DOCUMENTS

| | | | |
|---|---|---|---|
| 4,992,305 A | 2/1991 | Erbil | |
| 4,996,108 A | 2/1991 | Divigalpitiya et al. | |
| 5,958,358 A | 9/1999 | Tenne et al. | |
| 6,077,355 A | 6/2000 | Yamashita et al. | |
| 7,858,152 B2 | 12/2010 | Ovshinsky et al. | |
| 9,691,611 B2 * | 6/2017 | Yeh ................... | H01L 21/02568 |
| 9,863,039 B2 * | 1/2018 | Min ..................... | C23C 16/305 |
| 2013/0140505 A1 * | 6/2013 | Rowe ..................... | B82Y 30/00 |
| | | | 252/519.4 |
| 2014/0027775 A1 | 1/2014 | Quick et al. | |
| 2014/0227863 A1 * | 8/2014 | Quick .................. | C23C 16/305 |
| | | | 438/478 |
| 2014/0245946 A1 | 9/2014 | Kong et al. | |
| 2014/0251204 A1 | 9/2014 | Najmaei et al. | |
| 2014/0332814 A1 | 11/2014 | Peng et al. | |
| 2014/0353166 A1 | 12/2014 | Iezzi et al. | |
| 2015/0122315 A1 * | 5/2015 | Shin ........................ | H01L 29/73 |
| | | | 136/255 |
| 2015/0360944 A1 * | 12/2015 | Kim ........................ | H01B 1/06 |
| | | | 423/509 |
| 2016/0047050 A1 | 2/2016 | Kim et al. | |
| 2016/0168694 A1 * | 6/2016 | Min ..................... | C23C 16/305 |
| | | | 423/561.1 |
| 2017/0194144 A1 * | 7/2017 | Duan ................ | H01L 21/02628 |

FOREIGN PATENT DOCUMENTS

| | | |
|---|---|---|
| JP | H1012601 A | 1/1998 |
| JP | 3302108 B2 | 7/2002 |
| KR | 19900011670 A | 8/1990 |

(Continued)

OTHER PUBLICATIONS

Almond, et al. "Growth of thin layers of metal sulfides by chemical vapour deposition using dual source and single source precursors: routes to Cr2S3, a-MnS and FeS", Journal of Materials Chemistry, vol. 10, No. 12, pp. 2842-2846 (2000).

(Continued)

*Primary Examiner* — Douglas J McGinty
(74) *Attorney, Agent, or Firm* — Harness, Dickey & Pierce, P.L.C.

(57) ABSTRACT

Provided are a composition for forming a layered transition metal chalcogenide compound layer and a method of forming a layered transition metal chalcogenide compound layer by using the composition. The composition includes at least one of a transition metal precursor represented by Formula 1 and a chalcogenide precursor represented by Formula 2.

$$M_a(R_1)_{6-b-c}(H)_b(R_2)_c \qquad \text{[Formula 1]}$$

wherein, in Formula 1, M, $R_1$, $R_2$, a, b, and c are the same as defined in the detailed description, and $$M'_k X_2 \qquad \text{[Formula 2]}$$

wherein, in Formula 2, M' and X are the same as defined in the detailed description.

21 Claims, 11 Drawing Sheets

(56) References Cited

FOREIGN PATENT DOCUMENTS

| KR | 2007-0101361 A | 10/2007 | |
|---|---|---|---|
| KR | 101464173 B1 | 11/2014 | |
| KR | 10-2015-0015183 A | 2/2015 | |
| KR | 101500944 B1 | 3/2015 | |
| WO | WO-2015016412 A1 * | 2/2015 | ........... C23C 16/305 |

OTHER PUBLICATIONS

Extended European Search Report dated Sep. 21, 2016 issued in corresponding European Application No. 16166676.3.

Lin, et al. "Wafer-scale MoS2 thin layers prepared by MoO3 sulfurization" Nanoscale, vol. 4, pp. 6637-6641 (2012).

Huang, et al. "Lateral heterojunctions within monolayer MoSe2-WSe2 semiconductors", Nature Materials, Advanced Online Publication, pp. 1-6, (2014).

Wang, et al. "Electronics and optoelectronics of two-dimensional transition metal dichalcogenides", Nature Technology, vol. 7. pp. 699-712, (2012).

Xia, et al. "Two-dimensional material nanophotonics", Nature Photonics, vol. 8, pp. 899-907, (2014).

Cheng, et al. "Van der Waals epitaxial growth of MoS2 on SiO2/Si by chemical vapor deposition", The Royal Society of Chemistry, vol. 3, pp. 17287-17293, (2013).

Ling, et al. "Role of the Seeding Promoter in MoS2 Growth by Chemical Vapor Deposition", Nano Letters, vol. 14, pp. 464-472, (2014).

Liu, et al. "Mesoscale Imperfections in MoS2 Atomic Layers Grown by a Vapor Transport Technique", Nano Letters, vol. 14, pp. 4682-4686 (2014).

Liu, et al. "Growth of Large-Area and Highly Crystalline MoS2 Thin Layers on insulating Substrates", Nano Letters, vol. 12, pp. 1538-1544, (2012).

Jung, et al. "Chemically Synthesized Heterostructures of Two-Dimensional Molybdenum/Tungsten-Based Dichalcogenides with Vertically Aligned Layers", ACSNano, American Chemical Society, pp. A-H, (2014).

Lee, et al. "Synthesis and Transfer of Single-Layer Transition Metal Disulfides on Diverse Surfaces", Nano Letters, vol. 13, pp. 1852-1857, (2013).

Tarasov, et al. "Highly Uniform Trilayer Molybdenum Disulfide for Wafer-Scale Device Fabrication", Advanced Functional Materials, pp. 1-12, (2014).

* cited by examiner

COMPOSITION FOR LAYERED TRANSITION METAL CHALCOGENIDE COMPOUND LAYER AND METHOD OF FORMING LAYERED TRANSITION METAL CHALCOGENIDE COMPOUND LAYER

RELATED APPLICATIONS

This application claims the benefit of U.S. Patent Application No. 62/151,012, filed on Apr. 22, 2015, and Korean Patent Application No. 10-10-2015-0064899, filed on May 8, 2015, in the Korean Intellectual Property Office, the disclosures of which are incorporated herein in their entirety by reference.

BACKGROUND

1. Field

The present disclosure relates to a composition for a layered transition metal chalcogenide compound layer and a method of forming a layered transition metal chalcogenide compound layer.

2. Description of Related Art

A transition metal chalcogenide compound may have electrically, magnetically, and optically large anisotropic properties and unique physical properties. There has been increasing interest in the application of the transition metal chalcogenide compound. The transition metal chalcogenide compound may be formed from growing into a chalcogenide compound layer having a 2-dimensional layered structure with semiconductor characteristics on a large-sized substrate. The transition metal chalcogenide compound may by grown on a large-sized panel.

SUMMARY

In example embodiments, a composition relates to layered transition metal chalcogenide compound layer that may form a large-sized layered transition metal chalcogenide compound layer of high quality, where a thickness of the layered transition metal chalcogenide compound layer may be easily controlled.

In example embodiments, a method includes forming a layered transition metal chalcogenide compound layer by using the composition for a layered transition metal chalcogenide compound layer.

Additional aspects will be set forth in part in the description which follows and, in part, will be apparent from the description, or may be learned by practice of example embodiments.

According to an example embodiments, a composition for forming a layered transition metal chalcogenide compound layer includes i) at least one selected from a transition metal precursor represented by Formula 1 and a transition metal precursor represented by Formula 1d, and ii) a chalcogenide precursor represented by Formula 2:

$$M_a(R_1)_{6-b-c}(H)_b(R_2)_c \qquad \text{[Formula 1]}$$

wherein, in the above Formula 1, M is a transition metal. $R_1$ and $R_2$ are each independently one of a hydrogen atom; a C1-C10 alkyl group; a C2-C10 alkenyl group; a carbonyl group (C=O); a halogen; a C6-C10 aryl group; a C5-C10 cycloalkyl group; a C5-C10 cycloalkenyl group; (C=O)R, where, R is one of a hydrogen atom and a C1-C10 alkyl group; a C1-C10 alkoxy group; a C1-C10 amidinate group; a C1-C10 amidino group; a C1-C10 alkylamide group; a C1-C10 alkylimide group; —N(R)(R'), where, R and R' are each independently one of a C1-C10 alkyl group and a hydrogen atom; R(C=O)CN, where, R is one of a hydrogen atom and a C1-C10 alkyl group; and a C1-C10 β-diketonate group. Also, a is 1 or 2, b is an integer of 0 to 3, and c is an integer of 0 to 3. At least one of $R_1$ and $R_2$ is not a hydrogen atom.

$$M(R_1)_d \qquad \text{[Formula 1d]}$$

wherein, in Formula 1d, M is a transition metal, $R_1$ is a hydrogen atom; a C1-C10 alkyl group; a C2-C10 alkenyl group; a carbonyl group (C=O); a halide; a C6-C10 aryl group; a C5-C10 cycloalkyl group; a C6-C10 cycloalkenyl group; (C=O)R, where, R is a hydrogen atom or a C1-C10 alkyl group; a C1-C10 alkoxy group; a C1-C10 amidinate group; a C1-C10 alkylamide group; a C1-C10 alkylimide group; —N(R)(R'), where, R and R' are each independently a C1-C10 alkyl group or a hydrogen atom; R(C=O)CN, where, R is a hydrogen atom or a C1-C10 alkyl group; or a C1-C10 β-diketonate group, d is 3 or 4.

$$M'_k X_2 \qquad \text{[Formula 2]}$$

wherein, in the above Formula 2, M' is a chalcogenide element. Each X is independently one of a hydrogen atom; a C1-C10 alkyl group; a C2-C10 alkenyl group; a carbonyl group (C=O); a halogen; a C6-C10 aryl group; a C5-C10 cycloalkyl group; a C5-C10 cycloalkenyl group; (C=O)R, where, R is one of a hydrogen atom and a C1-C10 alkyl group; a C1-C10 alkoxy group; a C1-C10 amidinate group; a C1-C10 alkylamide group; a C1-C10 alkylimide group; —N(R)(R'), where, R and R' are each independently one of a C1-C10 alkyl group and a hydrogen atom; R(C=O)CN, where, R is one of a hydrogen atom and a C1-C10 alkyl group; and a C1-C10 β-diketonate. Also, k is 1 or 2. At least one X among $X_2$ is not a hydrogen atom.

In example embodiments, the transition metal precursor represented by Formula 1 and the chalcogenide precursor represented by Formula 2 may have a partial vapor pressure of 0.1 Torr or higher at a temperature of about 350° C. or lower.

In example embodiments, the transition metal may be one of tungsten (W), molybdenum (Mo), zirconium (Zr), tantalum (Ta), hafnium (Hf), niobium (Nb), platinum (Pt), cobalt (Co), nickel (Ni), chrome (Cr), vanadium (V), palladium (Pd), gold (Au), rhenium (Re), yttrium (Y), technetium (Tc), and titanium (Ti).

In example embodiments, the transition metal precursor may be represented by one of Formulae 1a to 1c:

$$M(R_1)_6, \qquad \text{[Formula 1a]}$$

$$M(R_1)_3, \text{ and} \qquad \text{[Formula 1b]}$$

$$M(R_1)_4, \qquad \text{[Formula 1c]}$$

wherein, in the above Formulae 1a to 1c, M may be one of tungsten (W) and molybdenum (Mo), and each $R_1$ may independently be one of a carbonyl group (CO), a propylcyclopentadienyl group, a bicyclo[2.2.1]hepta-2,5-diene group, a cycloheptatriene group, and an acetonitrile group.

In example embodiments, the chalcogenide precursor may be represented by Formula 2a:

$$M'_k X_2 \qquad \text{[Formula 2a]}$$

wherein, in Formula 2a, M' may be one of sulfur (S) and tellurium (Te). X may a C1-C10 alkyl group, and k may be 1 or 2.

In example embodiments, the transition metal precursor may be at least one of molybdenum hexacarbonyl, (bicyclo

[2.2.1]hepta-2,5-diene)tetracarbonyl molybdenum(0), cyclopentadienylmolybdenum(II) tricarbonyl dimer, (propylcyclopentadienyl)molybdenum(I) tricarbonyl dimer, tricarbonyl(cycloheptatriene) molybdenum(0), tris(acetonitrile) tricarbonyl molybdenum(0), tungsten hexacarbonyl, bis(isopropylcyclopentadienyl)tungsten(IV) dihydride, cyclopentadienyltungsten(II) tricarbonyl hydride, bis(tert-butylimino)bis(dimethylamino)tungsten(VI), tetracarbonyl(1,5-cyclohexadiene)tungsten, tricarbonyl(cycloheptatriene) molybdenum(0), (propylcyclopentadienyl)molybdenum(I) tricarbonyl dimer, cyclopetnatdienyl molybdenum(II), tungsten hexacarbonyl, (bicyclo[2.2.1]hepta-2,5-diene)tetracarbonyl molybdenum(0), bis(isopropylcyclopentadienyl)tungsten(IV) dihydride, and tetracarbonyl(1,5-cyclooctadiene) tungsten(0).

In example embodiments, the chalcogenide precursor may be at least one of dimethyl sulfide, diethyl sulfide, di-tert-butyl sulfide, dimethyl disulfide, diethyl disulfide, di-tert-butyl disulfide, tert-butyl thiol, dimethyl selenide, diethyl diselenide, diisopropyl selenide, and di-tert-butyl selenide.

In example embodiments, the composition may further include a carrier gas. The transition metal precursor and the chalcogenide precursor may be provided in the carrier gas, and a mixing volume ratio of the transition metal precursor and the chalcogenide precursor may be in a range of about 1:100 to about 1:1500.

According to an example embodiments, a composition may include one of a transition metal precursor represented by Formula 1 and a chalcogenide precursor represented by Formula 2:

  [Formula 1]

  [Formula 2]

In the above Formulas 1 and 2, M is a transition metal, and M' is a chalcogenide element. $R_1$, $R_2$, and each X are each independently one of a hydrogen atom; a C1-C10 alkyl group; a C2-C10 alkenyl group; a carbonyl group (C=O); a halogen; a C6-C10 aryl group; a C5-C10 cycloalkyl group; a C5-C10 cycloalkenyl group; (C=O)R, where R is one of a hydrogen atom and a C1-C10 alkyl group; a C1-C10 alkoxy group; a C1-C10 amidinate group; a C1-C10 amidino group; a C1-C10 alkylamide group; a C1-C10 alkylimide group; —N(R)(R'), where R and R' are each independently one of a C1-C10 alkyl group and a hydrogen atom; R(C=O) CN, where R is one of a hydrogen atom and a C1-C10 alkyl group; and a C1-C10 β-diketonate group. Also, a is 1 or 2, b is an integer of 0 to 3, and c is an integer of 0 to 3. At least one of $R_1$ and $R_2$ is not a hydrogen atom. Also, k is 1 or 2. At least one X among $X_2$ is not a hydrogen atom.

In example embodiments, the one of the transition metal precursor and the chalcogenide precursor may be the transition metal precursor.

In example embodiments, the transition metal may be one of tungsten (W), molybdenum (Mo), zirconium (Zr), tantalum (Ta), hafnium (Hf), niobium (Nb), platinum (Pt), cobalt (Co), nickel (Ni), chrome (Cr), vanadium (V), palladium (Pd), gold (Au), rhenium (Re), yttrium (Y), technetium (Tc), and titanium (Ti).

In example embodiments, the transition metal precursor may be represented by one of Formulae 1a to 1c:

  [Formula 1a]

  [Formula 1b]

  [Formula 1c]

wherein, in the above Formulae 1a to 1c, M may be one of tungsten (W) and molybdenum (Mo), and $R_1$ may be one of a carbonyl group (CO), a propylcyclopentadienyl group, a bicyclo[2.2.1]hepta-2,5-diene group, a cycloheptatriene group, and an acetonitrile group.

In example embodiments, the one of the transition metal precursor and the chalcogenide precursor may be the chalcogenide precursor.

In example embodiments, the chalcogenide precursor may be represented by Formula 2a:

  [Formula 2a]

wherein, in Formula 2a, M' may be one of sulfur (S) and tellurium (Te). X may a C1-C10 alkyl group, and k may be 1 or 2.

In example embodiments, the chalcogenide precursor may be at least one of dimethyl sulfide, diethyl sulfide, di-tert-butyl sulfide, dimethyl disulfide, diethyl disulfide, di-tert-butyl disulfide, tert-butyl thiol, dimethyl selenide, diethyl diselenide, diisopropyl selenide, and di-tert-butyl selenide.

According to example embodiments, a method of preparing a layered transition metal chalcogenide compound layer includes loading a substrate into a reactor; independently providing the transition metal precursor and the chalcogenide precursor in a gaseous state on the substrate loaded into the reactor; and performing chemical vapor deposition (CVD) by contacting the transition metal precursor and the chalcogenide precursor with the substrate.

In example embodiments, the performing chemical vapor deposition may be performed at a reactor temperature in a range of about 550° C. to about 950° C.

In example embodiments, the method may further include performing a heat-treatment on the substrate after performing the CVD.

In example embodiments, the independently providing the composition and an other of the transition metal precursor and the chalcogenide precursor may include: storing the transition metal precursor and the chalcogenide precursor in containers that are independent from each other; and supplying the transition metal precursor and the chalcogenide precursor from the containers to the reactor through independent injection lines.

In example embodiments, the substrate may be at least one of a conductor, a semiconductor, and an insulator.

BRIEF DESCRIPTION OF THE DRAWINGS

The foregoing and other features of inventive concepts will be apparent from the more particular description of non-limiting embodiments of inventive concepts, as illustrated in the accompanying drawings in which like reference characters refer to like parts throughout the different views. The drawings are not necessarily to scale, emphasis instead being placed upon illustrating principles of inventive concepts. In the drawings.

DETAILED DESCRIPTION

Figure 1:
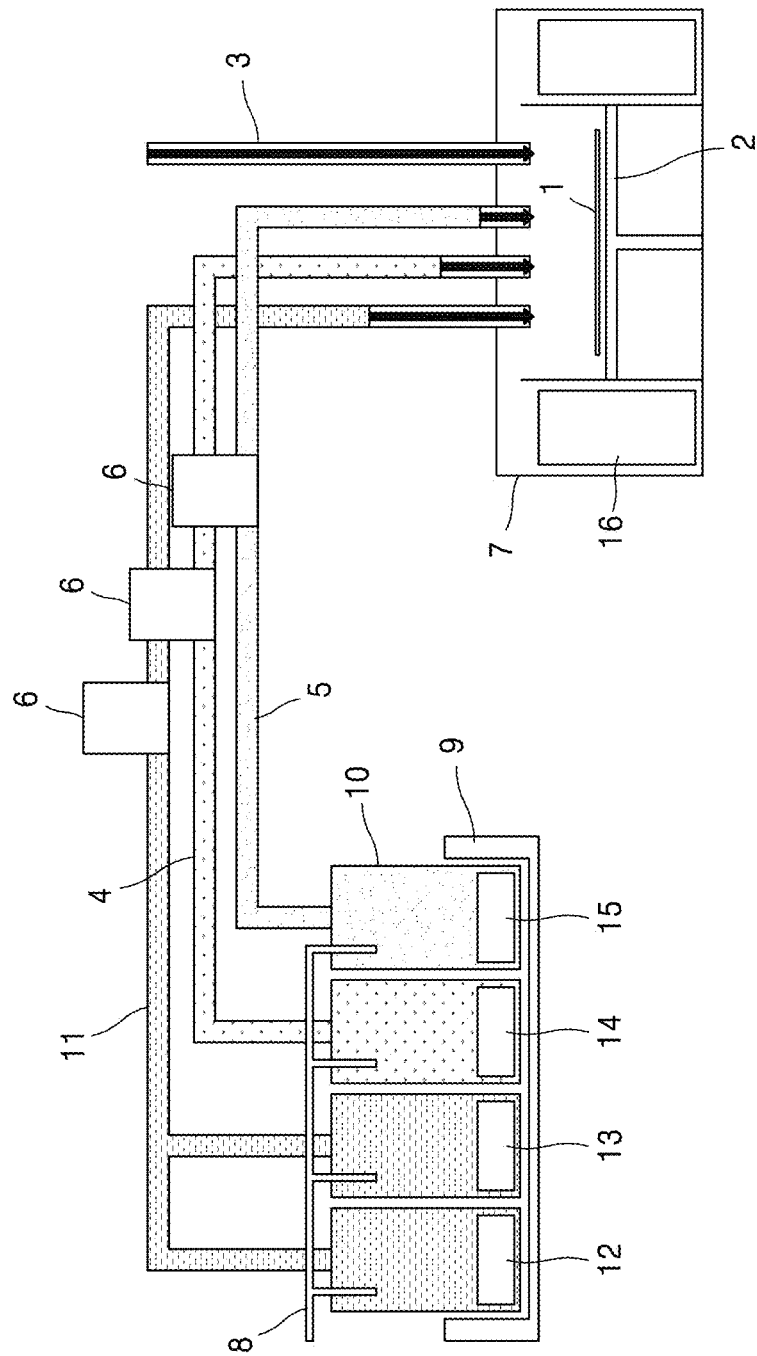
FIG. 1 is a schematic view illustrating a structure of a chemical vapor deposition apparatus used for preparing a layered transition metal chalcogenide compound layer according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region or an implanted region illustrated as a rectangle may have rounded or curved features. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Hereinafter, compositions for a layered transition metal chalcogenide compound layer according to example embodiments and methods of preparing a layered transition metal chalcogenide compound layer by using the composition, and a layered transition metal chalcogenide compound layer prepared by using the method will be described in detail.

According to example embodiments, a composition for forming a layered transition metal chalcogenide compound layer including i) at least one selected from a transition metal precursor represented by Formula 1 and a transition metal precursor represented by Formula 1d, and ii) a chalcogenide precursor represented by Formula 2 is provided.

$$M_a(R_1)_{6-b-c}(H)_b(R_2)_c \quad \text{[Formula 1]}$$

In Formula 1, M is a transition metal. $R_1$ and $R_2$ are each independently a hydrogen atom, a C1-C10 alkyl group, a C2-C10 alkenyl group, a carbonyl group (C=O), a halogen, a C6-C10 aryl group, a C5-C10 cycloalkyl group, a C5-C10 cycloalkenyl group, (C=O)R (where, R is a hydrogen atom or a C1-C10 alkyl group), a C1-C10 alkoxy group, a C1-C10 amidinate group, a C1-C10 amidino group, a C1-C10 alkylamide group, a C1-C10 alkylimide group, —N(R)(R') (where, R and R' are each independently a C1-C10 alkyl group or a hydrogen atom), R(C=O)CN (where, R is a hydrogen atom or a C1-C10 alkyl group), or a C1-C10 β-diketonate group, a is 1 or 2, b is 0 to 3, and c is 0 to 3, provided that $R_1$ and $R_2$ are not hydrogen atoms at the same time. $R_1$ and $R_2$ may be the same or different, provided that $R_1$ and $R_2$ are not hydrogen atoms at the same time. In Formula 1, $(R_1)_{6-b-c}$ may be omitted because b may be 3 and c may be 3, $(H)_b$ may be omitted because b may be 0, and/or $(R_2)_c$ may be omitted because c may be 0.

$$M(R_1)_d \quad \text{[Formula 1d]}$$

wherein, in Formula 1d, M is a transition metal, $R_1$ is a hydrogen atom; a C1-C10 alkyl group; a C2-C10 alkenyl group; a carbonyl group (C=O); a halide; a C6-C10 aryl group; a C5-C10 cycloalkyl group; a C6-C10 cycloalkenyl group; (C=O)R, where, R is a hydrogen atom or a C1-C10 alkyl group; a C1-C10 alkoxy group; a C1-C10 amidinate group; a C1-C10 alkylamide group; a C1-C10 alkylimide group; —N(R)(R'), where, R and R' are each independently a C1-C10 alkyl group or a hydrogen atom; R(C=O)CN, where, R is a hydrogen atom or a C1-C10 alkyl group; or a C1-C10 β-diketonate group, d is 3 or 4, $$M'_kX_2 \quad \text{[Formula 2]}$$

In Formula 2, M' is a chalcogenide element, X is a hydrogen atom, a C1-C10 alkyl group, a C2-C10 alkenyl group, a carbonyl group (C=O), a halogen, a C6-C10 aryl group, a C5-C10 cycloalkyl group, a C5-C10 cycloalkenyl group, (C=O)R (where, R is a hydrogen atom or a C1-C10 alkyl group), a C1-C10 alkoxy group, a C1-C10 amidinate group, a C1-C10 alkylamide group, a C1-C10 alkylimide group, —N(R)(R') (where, R and R' are each independently a C1-C10 alkyl group or a hydrogen atom), R(C=O)CN (where, R is a hydrogen atom or a C1-C10 alkyl group), or a C1-C10 β-diketonate group, k is 1 or 2, and provided that all Xs are not hydrogen atoms at the same time. In Formula 2, each X may be the same or different, but all X in Formula 2 cannot both be hydrogen atoms.

The composition is used to form a layered transition metal chalcogenide compound layer by using a chemical vapor deposition technique.

The layered transition metal chalcogenide compound layer is useful as a semiconductor material that may be utilized in an electronic device such as a nanoscale electronic device. As miniaturization of an electronic device leads to reduction in design rules, a precise thickness control and uniformity of a thin layer are desired for the layered transition metal chalcogenide compound layer. The layered transition metal chalcogenide compound layer may be prepared by using a chemical vapor deposition (CVD) technique.

In a typical CVD process, a substrate is exposed to one or more volatile precursors, which react or decompose on a surface of the substrate to produce the desired deposit. However, in the typical CVD process, when the layered transition metal chalcogenide compound layer is prepared by using typical precursors, vaporization temperatures of the transition metal precursor and the chalcogenide precursor in a reaction chamber are different from each other. Thus, the precursors may not be injected into the chamber in the state of gas and amounts of the precursors provided may not be controlled. As a result, in a typical CVD process, it may be difficult to control the number of layers, homogenize the overall composition, and form a large-sized and high-quality layered transition metal chalcogenide compound layer. Therefore, improvements in these aspects are desired.

According to example embodiments, a method of preparing a layered transition metal chalcogenide compound layer allows for controlling a thickness and the number of layers of the layered transition metal chalcogenide compound layer. Thus, in example embodiments, high quality manufacturing of the layered transition metal chalcogenide compound layer may be achieved. Additionally, in example embodiments, improving a rate for forming the layers of the layered transition metal chalcogenide compound layer, improving a thickness difference of the layered transition metal chalcogenide compound layers, and improving a composition reproducibility of the layered transition metal chalcogenide layers may be achieved by performing a chemical vapor deposition technique using a composition for a layered transition metal chalcogenide compound layer according to example embodiments. In example embodiments, the composition may include a transition metal precursor and a chalcogenide precursor that may be deposited at a temperature lower than a deposition temperature of the layered transition metal chalcogenide compound layers using a typical precursor.

In example embodiments, the transition metal precursor and the chalcogenide precursor may be materials that have a sufficient gas partial pressure at a low temperature (e.g., about 80° C. or lower and greater than about ° C.), which of each includes at least one carbon compound ligand. A carbon number of the carbon compound ligand may be 1 to 10.

The precursors are not decomposed until a temperature of the reactor reaches a homogeneous reaction temperature and maintains sufficient partial pressures at the homogeneous reaction temperature. Thus, vaporization temperatures of the precursors are not relatively high, and partial vapor pressures of the precursors at a low temperature are relatively high.

The transition metal precursor represented by Formula 1 and the chalcogenide precursor represented by Formula 2 may have a partial vapor pressure of about 5 Torr or higher at a temperature of about 350° C. or lower. For example, the transition metal precursor represented by Formula 1 and the chalcogenide precursor represented by Formula 2 may have a partial vapor pressure in a range of about 5 Torr to about 700 Torr at a temperature of about 350° C. or lower, or, for example, in a range of about 30° C. to about 150° C. In this regard, the transition metal precursor and the chalcogenide precursor are in a solid or liquid state and may have a sufficient partial vapor pressure sufficient for reaction at a low temperature (about 80° C. or lower). Also, the transition metal precursor represented by Formula 1 and the chalcogenide precursor represented by Formula 2 are novel compounds that are stable in water, easy to handle, convenient to store, and improved in thermal stability.

The transition metal (M) may a transition metal of Group 3 to Group 10. For example, M may include one of tungsten (W), molybdenum (Mo), zirconium (Zr), tantalum (Ta), hafnium (Hf), niobium (Nb), platinum (Pt), cobalt (Co), nickel (Ni), chrome (Cr), vanadium (V), palladium (Pd), gold (Au), rhenium (Re), yttrium (Y), technetium (Tc), and titanium (Ti).

The chalcogenide may be, for example, sulfur (S), selenium (Se), or tellurium (Te).

The transition metal precursor represented by Formula 1 may be, for example, at least one selected from transition metal precursors represented by Formulae 1a to 1c.

$$M(R_1)_6 \qquad \text{[Formula 1a]}$$

In Formula 1a, M is tungsten (W) or molybdenum (Mo), $R_1$ is each independently one selected from the group consisting of a carbonyl group (CO), a propylcyclopentadienyl group, a bicyclo[2.2.1]hepta-2,5-diene group, a cycloheptatriene group, and an acetonitrile group.

$$M(R_1)_3 \qquad \text{[Formula 1b]}$$

In Formula 1 b, M is tungsten (W) or molybdenum (Mo), $R_1$ is each independently one selected from the group consisting of a carbonyl group (CO), a propylcyclopentadienyl group, a bicyclo[2.2.1]hepta-2,5-diene group, a cycloheptatriene group, and an acetonitrile group; and $$M(R_1)_4 \qquad \text{[Formula 1c]}$$

In Formula 1c, M is tungsten (W) or molybdenum (Mo), $R_1$ is each independently one selected from the group consisting of a carbonyl group (CO), a propylcyclopentadienyl group, a bicyclo[2.2.1]hepta-2,5-diene group, a cycloheptatriene group, and an acetonitrile group.

In Formulae 1a to 1c, each $R_1$ may be the same group or at least some $R_1$ may be different groups from each other.

The chalcogenide precursor represented by Formula 2 may be a precursor represented by Formula 2a.

$$M'_k X_2 \qquad \text{[Formula 2a]}$$

In Formula 2a, M' is sulfur (S), selenium (Se), or tellurium (Te), X is a C1-C10 alkyl group, and k is 1 or 2. In Formula 2a, each X may be the same or different.

Examples of the C1-C10 alkyl group may include a methyl group, an ethyl group, a propyl group, and a butyl group, but are not limited thereto.

The transition metal precursor represented by Formula 1 may be, for example, at least one of molybdenum hexacarbonyl, (bicyclo [2.2.1]hepta-2,5-diene)tetracarbonyl molybdenum(0), cyclopentadienylmolybdenum(II) tricarbonyl dimer, (propylcyclopentadienyl)molybdenum(I) tricarbonyl dimer, tricarbonyl(cycloheptatriene) molybdenum(0), tris(acetonitrile) tricarbonyl molybdenum(0), tungsten hexacarbonyl, bis(isopropylcyclopentadienyl)tungsten(IV) dihydride, cyclopentadienyltungsten(II) tricarbonyl hydride, bis(tert-butylimino)bis(dimethylamino)tungsten(VI), tetracarbonyl(1,3-cyclohexadiene)tungsten, and tetracarbonyl(1,5-cyclooctadiene)tungsten(0). However, example embodiments are not limited thereto.

The chalcogenide precursor represented by Formula 2 may be at least one of dimethyl sulfide, diethyl sulfide, di-tert-butyl sulfide, dimethyl disulfide, diethyl disulfide, di-tert-butyl disulfide, tert-butyl thiol, dimethyl selenide, diethyl diselenide, diisopropyl selenide, and di-tert-butyl selenide. However, example embodiments are not limited thereto.

According to example embodiments, a method of preparing a layered transition metal chalcogenide compound layer is provided.

A chemical vapor deposition (CVD) technique in the semiconductor industry for depositing layers of various materials., Examples of the CVD method may include organic metal chemical vapor deposition, cyclic chemical vapor deposition, direct liquid injection CVD, low-pressure CVD, microwave-enhanced CVD, and plasma-enhanced CVD, but example embodiments are not limited thereto.

In example embodiments, the method provides a 2-dimensional layered transition metal chalcogenide compound layer that has a controllable thickness, high quality, and may be grown into a large size.

Hereinafter, the method will be described in detail.

First, a substrate, on which a layered transition metal chalcogenide compound layer is to be formed, is placed in a reactor.

The transition metal precursor and the chalcogenide precursor of the composition for a layered transition metal chalcogenide compound layer are independently provided onto the substrate placed in the reactor. When the precursors are in a solid or liquid state, the transition metal precursor represented by Formula 1 and the chalcogenide precursor represented by Formula 2 may be supplied to the reactor by using a carrier gas (e.g., nitrogen or argon).

As described above, chemical vapor deposition may be performed by contacting the independently provided transition metal precursor and chalcogenide precursor with the substrate, and thus the desired layered transition metal chalcogenide compound layer may be obtained. When the deposition is performed in this manner, the precursors may be provided to the reactor in a gaseous state, and thus no precursor may be lost, and the precursors may be controlled in a small amount.

When the transition metal precursor and the chalcogenide precursor are not provided to the substrate in the reactor independently but provided together, a carrier gas needs to be continuously injected at an amount larger than a stoichiometric amount if necessary due to different vaporization temperatures of the transition metal precursor and the chalcogenide precursor, and a layer having the desired composition may not be formed since an excessive amount of reaction gas is present in the reactor.

A mixing flow ratio of the transition metal precursor and the chalcogenide precursor may be used to suit a stoichiometric amount of the desired layered transition metal chalcogenide compound. For example, the mixing flow ratio of the transition metal precursor and the chalcogenide precursor is in a range of about 1:100 to about 1:1500, or, for example, about 1:100 to about 1:1300.

A mixing volume ratio of the transition metal precursor and the chalcogenide precursor may be used to suit a stoichiometric amount of the desired layered transition metal chalcogenide compound. For example, the mixing volume ratio of the transition metal precursor and the chalcogenide precursor is in a range of about 1:1 to about 1:1500, or, for example, about 1:2 to about 1:1300.

The chemical vapor deposition in the reactor may be performed at a temperature in a range of about 550° C. to about 950° C., or, for example, about 580° C. to about 920° C. For example, the temperature of the reactor may be in a range of about 550° C. to about 950° C., or, for example, about 580° C. to about 920° C. Also, the chemical vapor deposition is performed at a pressure in a range of about 5 Torr to about 700 Torr.

The substrate may be one of a conductor, a semiconductor, and an insulator. The conductor may be metal, a metal alloy, graphene, or a combination thereof. Also, the semiconductor may be a Group III-V semiconductor (e.g., GaN) or a Group IV semiconductor (e.g., Si). The insulator may be an oxide-based material (e.g., silicon oxide) or a nitride-based material (e.g., silicon nitride). However, example embodiments are not limited thereto.

Impurities or foreign substances on a surface of the substrate may be removed by performing a cleaning process before reacting the substrate with the transition metal precursor and the chalcogenide precursor. The cleaning process may be performed by using hydrogen, by argon sputtering, or by reactive washing.

The method may further include a process of heat-treatment. The heat-treatment process may be performed after performing the chemical vapor deposition. The heat-treatment process may be performed at a temperature (e.g., reactor temperature) in a range of about 100° C. to about 1100° C. After the heat-treatment process, a monocrystalline or polycrystalline layer may be prepared according to the heat-treatment temperature.

The transition metal precursor and the chalcogenide precursor are stored into spaces independent from each other and are provided to the reactor through independent injection lines. The transition metal precursor and the chalcogenide precursor are injected together into the reactor or alternately injected into the reactor.

According to example embodiments, a layered transition metal chalcogenide compound layer having a large size is prepared by using the method described above.

The layered transition metal chalcogenide compound layer includes a layered transition metal chalcogenide compound that is represented by Formula 3 and has a layered structure. The layered transition metal chalcogenide compound is a next-generation nanoelectronic material that can replace graphene or silicon as a layered semiconductor material which permits easy band gap control.

The layered transition metal chalcogenide compound includes a layered transition metal chalcogenide compound that has a layered structure including a plane of a transition metal M sandwiched between two planes of chalcogen atoms. Also, the layered structure includes the transition metal and the chalcogenide element that are bound by a covalent bond and the layers that are joined together by weak interaction (van der Waals force). The layered transition metal chalcogenide compound has high crystallinity and may have a monocrystalline state or a polycrystalline state.

$$M_1\text{-}M\text{-}M_1 \quad \text{[Formula 3]}$$

In Formula 3, $M_1$ denotes a chalcogenide element, and M denotes a transition metal. For example, the layered transition metal chalcogenide compound layer may be at least one selected from the group consisting of $MoS_2$, $WSe_2$, $WS_2$, $MoSe_2$, $TiS_2$, $TiSe_2$, $TiTe_2$, $VS_2$, $VSe_2$, $VTe_2$, $CrS_2$, $CoTe_2$, $NiTe_2$, $ZrS_2$, $ZrSe_2$, $YSe_2$, $NbS_2$, $NbSe_2$, $NbTe_2$, $TcS_2$, $TcSe_2$, $TcTe_2$, $PdS_2$, $PdSe_2$, $PdTe_2$, $LaSe_2$, $HfS_2$, $HfSe_2$, $HfTe_2$, $TaS_2$, $TaSe_2$, $TaTe_2$, $WS_2$, $WSe_2$, $WTe_2$, $ReS_2$, $ReSe_2$, $IrTe_2$, $PtS_2$, $PtSe_2$, $PtTe_2$, and $AuTe_2$.

Figure 3:
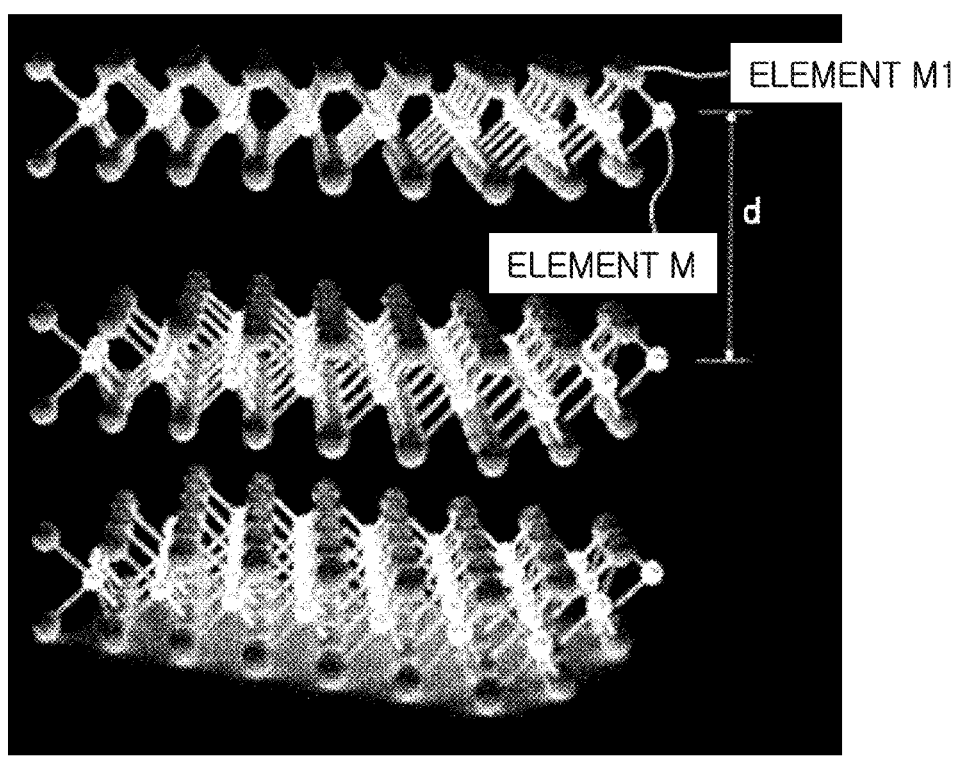
FIG. 3 is a schematic view of a multi-layer crystalline structure of the layered transition metal chalcogenide compound.

FIG. 3 illustrates a structure of $MoS_2$, which is one of the layered transition metal chalcogenide compounds according to example embodiments.

As shown in FIG. 3, a single-layer crystal, in which element M and element $M_1$ form a 2-dimensional covalent bond, may be formed, and multiple layers may be formed by vertically stacking the single-layers and join them together by atomic interaction of van der Waals force. When the multiple layers are formed, a distance between the layers (d) may be, for example, about 6.5 Å, in the case of $MoS_2$.

A thickness of a transition metal chalcogenide compound layer prepared by using a typical preparation method may be controlled at atomic level by mechanical peeling and chemical peeling, but manufacturing the transition metal chalcogenide compound layer into a large size is not easy. However, when a transition metal chalcogenide compound layer is prepared by using a method according to example embodiments, the number of layers of the transition metal chalcogenide compound layer may be easily controlled, and thus the transition metal chalcogenide compound layer may be easily secured as a thick material.

In example embodiments, the layered transition metal chalcogenide compound layer may include, for example, at least one selected from $MoS_{2-x}Se_x$ (where, $0 \leq x \leq 2$) $WS_{2-x}Se_x$ (where, $0 \leq x \leq 2$), $Mo_yW_{1-y}S_2$ (where, $0 \leq y \leq 1$), and $Mo_yW_{1-y}Se_2$ (where, $0 \leq y \leq 1$).

A thickness of the single layer of the large-sized transition metal chalcogenide compound layer may be, for example, in a range of about 0.65 nm to about 0.7 nm. Also, the transition metal chalcogenide compound layer of a large size may have an area uniformity at an area of, for example, about 10 $cm^2$ or greater.

When the layered transition metal chalcogenide compound layer according to example embodiments is a $MoS_2$ layer, a 70% absorption thickness during absorptivity using a deep ultraviolet (UV) ray may be in a range of about 20 nm to about 300 nm, or, for example, about 90 nm to about 150 nm. In this regard, the layered transition metal chalcogenide compound layer may have improved deep UV absorbing performance.

FIG. 1 is a schematic view illustrating a structure of a chemical vapor deposition apparatus according to example embodiments used for preparing a layered transition metal chalcogenide compound layer according to example embodiments.

The layered transition metal chalcogenide compound layer may include, for example, at least one selected from Mo and W, as a transition metal, and at least one selected from Se and S as a chalcogenide.

Referring to FIG. 1, a thermal jacket 9 is placed around a source canister 10 that stores at least one transition metal precursor and at least one chalcogenide precursor used in the chemical vapor deposition. The at least one transition metal precursor and at least one chalcogenide precursor may be stored in separate containers in the source canister 10. The metal precursors may include a molybdenum (Mo) precursor 12 and a tungsten (W) precursor 13. The chalcogenide precursors may include a selenium (Se) precursor 14 and a sulfur (S) precursor 15, which are chalcogenide precursors.

The thermal jacket 9 may control a temperature of the source canister 10 within an appropriate range. The temperature may be controlled to be maintained, for example, within a range of about 30° C. to about 150° C.

In the source canister 10, the molybdenum precursor 12 and the tungsten precursor 13 may be provided onto a substrate 1 in a reactor 7 through supply lines As shown in FIG. 1, the selenium precursor 14 may be provided to the substrate 1 in the reactor 7 at a reaction temperature in a gaseous state at a controlled amount through a supply line 4 (e.g., selenium precursor supply line). Also, the sulfur precursor 15 is provided in a gaseous state through a source line 5 to the substrate 1 in the reactor 7 at the reaction temperature.

Amounts of the precursors all provided in a gaseous state are controlled by using a flow controller 6, such as a mass flow controller (MFC) or an electronic pressure controller (EPC). In this regard, the transition metal precursors are stored in a source canister independent from a source canister of the chalcogenide precursors and provided through separate independent source lines when the transition metal precursors are provided in a gaseous state onto the substrate 1 in the reactor 7. The transition metal precursor and the chalcogenide precursor of separate gas states are provided onto the substrate 1 in the reactor 7, and thus the transition metal precursor and the chalcogenide precursor are provided in a pulse type. When the precursors are provided in this manner, various 2-dimensional layered transition metal chalcogenide compound layers of a large size may be formed. The layered transition metal chalcogenide compound layer may include one layer to ten layers, or, for example, one layer to five layers, and a thickness of a single layer of the layered transition metal chalcogenide compound layer may be in a range of about 0.65 nm to about 0.7 nm.

The layered transition metal chalcogenide compound layer may be used as a substrate for forming a 2-dimensional heterojunction structure. In a layer prepared by using a conventional method, a transition metal precursor and a chalcogenide precursor are not easily vaporized, and thus amounts of the precursor may not be easily controlled which has left no choice but to use a large amount of precursors. When a large amount of precursors is used, an amount of precursors remained inside the reactor increases, and thus an uncontrolled mixture structure (e.g., $MoS_{2-x}Se_x$) is formed while growing a heterojunction structure. Accordingly, a layer structure having a heterojunction structure (e.g., $MoSe_2/MoS_2$) of the desired structure may not be obtained.

However, when the method according to example embodiment is used, the precursors have a ligand structure which allows vaporization at a temperature lower than a vaporization temperature of a conventional transition metal precursor (e.g., $MoO_3$) are used; thus amounts of the precursors may be stoichiometrically controlled, and vapor pressures may be easily controlled to be within the desired range. Therefore, thickness uniformity of the layered transition metal chalcogenide compound layer may be easily secured, and the number of layers may be easily controlled to the desired number.

In FIG. 1, the reference number 3 denotes a hydrogen supply line, and the reference number 8 denotes a carrier gas supply line.

Before the transition metal precursor and the chalcogenide precursor are provided onto the substrate 1 of the reactor 7, impurities and foreign substances on a surface of the substrate 1 are removed by purging hydrogen on the substrate 1 in the reactor 7 through the hydrogen supply line 3.

Also, the carrier gas may be an inert gas, such as nitrogen or argon, and the carrier gas is used for control of a flow rate of a precursor gas and prevention (or limitation) of a back flow. The carrier gas may be provided to the source canister 10 through the gas supply line 8.

As shown in FIG. 1, a heat-retaining unit 16 is placed around the substrate 1 and a substrate acceptor 2 to maintain temperatures of the substrate 1 and the substrate acceptor 2 within appropriate ranges. Temperature of the substrate 1 and the substrate acceptor 2 varies depending on types of the substrate 1 and the substrate acceptor 2. For example, when the substrate 1 is a silicon substrate, temperatures of the substrate 1 and the substrate acceptor 2 may be maintained in a range of about 80° C. to about 120° C. Also, a heat source (not shown) may be placed around the substrate 1 and the substrate acceptor 2.

The layered transition metal chalcogenide compound layer has excellent flexibility, carrier mobility, and electronic and optical characteristics. Thus, the layer may be widely used in transparent and flexible field-effective transistors, semiconductor devices, memory optical devices, image sensors, and photodetectors.

Figure 2:
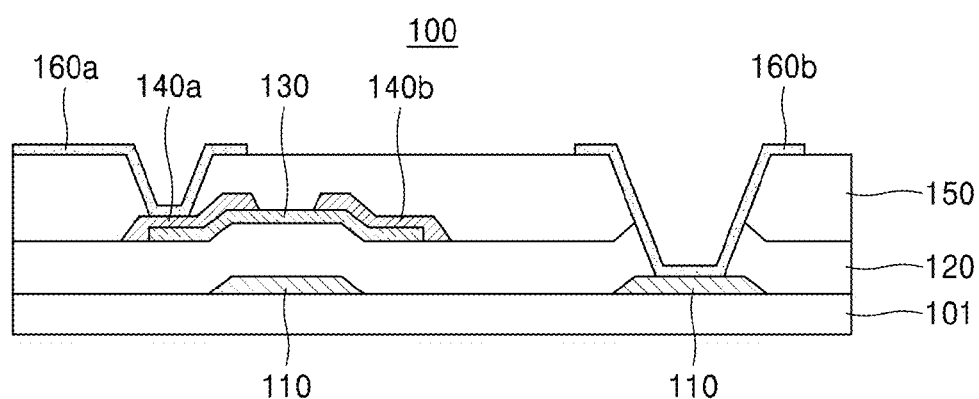
FIG. 2 is a cross-sectional view illustrating a structure of a semiconductor device including the layered transition metal chalcogenide compound layer.

FIG. 2 is a cross-sectional view schematically illustrating a structure of a semiconductor device 100 including the layered transition metal chalcogenide compound layer according to example embodiments.

Referring to FIG. 2, the semiconductor device 100 includes a gate electrode 110, a gate insulating layer 120, and a channel area 130 that are sequentially stacked on a substrate 101. Also, the semiconductor device 100 may further include a drain electrode 140a and a source electrode 140b that partially cover the channel area 130, and a passivation layer 150 may be disposed on the drain electrode 140a, the source electrode 140b, and the channel area 130. A pixel electrode 160a and an upper gate electrode 160b may be disposed penetrating through the passivation layer 150.

The substrate 101 may include glass, an insulating material, a semiconductor (e.g., Si), or plastic, but is not limited thereto. When the semiconductor device 100 is used in a display device, the substrate 101 may include an insulating material. The gate electrode 110 may include a conductive material and may be formed of combined layers including a transparent conducting layer and a non-transparent conducting layer. For example, the transparent conducting layer may include at least one of indium tin oxide (ITO), indium zinc oxide (IZO), and tin oxide (TO). The non-transparent conducting layer may include at least one of aluminum (Al), silver (Ag), copper (Cu), molybdenum (Mo), chrome (Cr), tantalum (Ta), and titanium (Ti).

The gate insulating layer 120 may include at least one of a silicon oxide ($SiO_2$), a silicon nitride ($Si_3N_4$), a silicon oxynitride (SiON), a hafnium oxide ($HfO_2$), a hafnium silicon oxide ($HfSi_xO_y$), an aluminum oxide ($Al_2O_3$), and a zirconium oxide ($ZrO_2$). The channel area 130 corresponds to a layer, where a channel is formed as an activation layer of the semiconductor device 100 between the drain electrode 140a and the source electrode 140b. The channel area 130 may be the transition metal chalcogenide compound layer.

The drain electrode 140a and the source electrode 140b may be symmetrically located from each other with the gate electrode 110 in the center. The source electrode 140b allows signals applied to the gate electrode 110 to be transmitted to the drain electrode 140a via the channel area 130. The drain electrode 140a and the source electrode 140b may include one selected from fire-resistant metals, such as molybdenum (Mo), chrome (Cr), tantalum (Ta), and titanium (Ti). The passivation layer 150 may be disposed on the drain electrode 140a, the source electrode 140b, and a part of the channel area 130 exposed to the outside to protect the part of the exposed channel area 130. The passivation layer 150 may include an inorganic insulating material or an organic insulating material. The pixel electrode 160*a* and the upper gate electrode 160*b* are in contact with the drain electrode 140*a* and the gate electrode 110, respectively. The signal transmitted through the drain electrode 140*a* may be charged in the pixel electrode 160*a*.

The semiconductor device 100 may be used as a thin film transistor or a switching device in a liquid crystal display (LCD) or an organic light-emitting display (OLED). The semiconductor device 100 is a bottom-gate structure, but example embodiments are not limited thereto, and may have a top-gate structure. An electrode structure of the semiconductor device 100 may vary.

Example embodiments will be described in further detail with reference to the following examples. These examples are for illustrative purposes only and are not intended to limit the scope of inventive concepts.

EXAMPLE 1

Formation of $MoS_2$ Layer

First, a silicon substrate, on which a layer is to be deposited, was loaded in a CVD reactor, and then the reactor was purged with nitrogen and heated to a temperature of about 350° C. at a pressure of 100 Torr.

A cleaning process using hydrogen was performed on the substrate to remove impurities and foreign substances on a surface of the silicon substrate.

Separate from the silicon substrate, tricarbonyl(cycloheptatriene)molybdenum(0) ($C_7H_8Mo(CO)_3$) and diethyl disulfide ($S_2(CH_3CH_2)_2$) were filled in individual source canisters connected to the CVD reactor.

Subsequently, a pressure and a temperature of the CVD reactor were controlled to about 700° C. and about 15 Torr, which are a pressure and a temperature for layer deposition. Vapor of the tricarbonyl(cycloheptatriene)molybdenum(0) ($C_7H_8Mo(CO)_3$) and diethyl disulfide ($S_2(CH_3CH_2)_2$) filled in the source canisters were introduced to the CVD reactor at a desired (and/or alternatively predetermined) flow rate through independent lines so that a CVD reaction for forming a $MoS_2$ layer was proceeded. Here, a pressure in the reactor was maintained constant at about 10 Torr. The flow rate of vapor of the tricarbonyl(cycloheptatriene)molybdenum(0) ($C_7H_8Mo(CO)_3$) and diethyl disulfide ($S_2(CH_3CH_2)_2$) was about 500 SCCM.

Then, before removing the $MoS_2$ layer-deposited substrate from the reactor, the CVD reactor was purged with nitrogen and cooled to room temperature to prepare a $MoS_2$ layer having a layered structure.

EXAMPLE 2

$MoS_2$ Layer

A $MoS_2$ layer having a layered structure was prepared in the same manner as in Example 1, except that (propylcyclopentadienyl)molybdenum(I) tricarbonyl dimer ($C_{22}H_{22}Mo_2O_6$) was used as the transition metal precursor.

EXAMPLE 3

$MoS_2$ Layer

A $MoS_2$ layer having a layered structure was prepared in the same manner as in Example 1, except that cyclopentadienylmolybdenum(II) tricarbonyl dimer ($C_{16}H_{10}Mo_2O_6$) was used.

EXAMPLE 4

$MoS_2$ Layer

A $MoS_2$ layer having a layered structure was prepared in the same manner as in Example 1, except that bicyclo[2.2.1]hepta-2,5-diene)tetracarbonylmolybdenum(0) ($C_{11}H_8MoO_4$) was used as the transition metal precursor.

EXAMPLE 5

$WS_2$ Layer

A $WS_2$ layer having a layered structure was prepared in the same manner as in Example 1, except that bis(isopropylcyclopentadienyl)tungsten(IV) dihydride was used as the transition metal precursor.

EXAMPLE 6

$MoSe_2$ Layer

A $MoSe_2$ layer having a layered structure was prepared in the same manner as in Example 1, except that a silicon oxide layer is additionally formed on the silicon substrate, and the CVD reaction for forming a $MoSe_2$ layer was proceeded by using diethyl diselenide instead of diethyl disulfide on the silicon oxide layer.

COMPARATIVE EXAMPLE 1

$MoS_2$ Layer

A substrate was placed in the center of a single tube-type reactor, about 1 mg of $MoO_3$ was loaded on a 10 cc alumina boat distanced apart at about 2 cm in an upstream direction from the substrate, and 1 g of a sulfur powder was placed in an upstream entry of a furnace in the same alumina boat, and a $MoS_2$ layer was formed according to a chemical vapor deposition technique at a temperature of about 750° C. and a pressure of 15 Torr.

EVALUATION EXAMPLE 1

Raman Spectrum Analysis

1) Example 1 and Example 6

A Raman spectrum analysis was performed on the $MoS_2$ layer prepared in Example 1 and the $MoSe_2$ layer prepared in Example 6. The Raman spectrum analysis was performed by using RM-1000 Invia instrument (514 nm, $Ar^+$ ion laser), and the results of the Raman spectrum analysis preformed on the $MoS_2$ layer prepared in Example 1 and the $MoSe_2$ layer prepared in Example 6 are shown in FIGS. 4 and 5, respectively.

Figure 4:
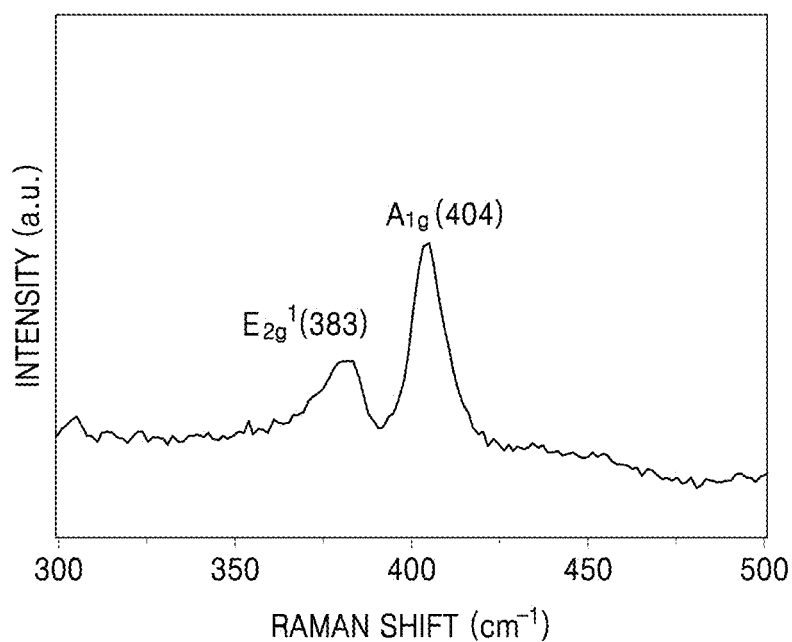
FIGS. 4 and 5 illustrate the results of Raman spectroscopy analysis performed on a $MoS_2$ layer prepared in Example 1 and a $MoSe_2$ layer prepared in Example 6.
Figure 5:
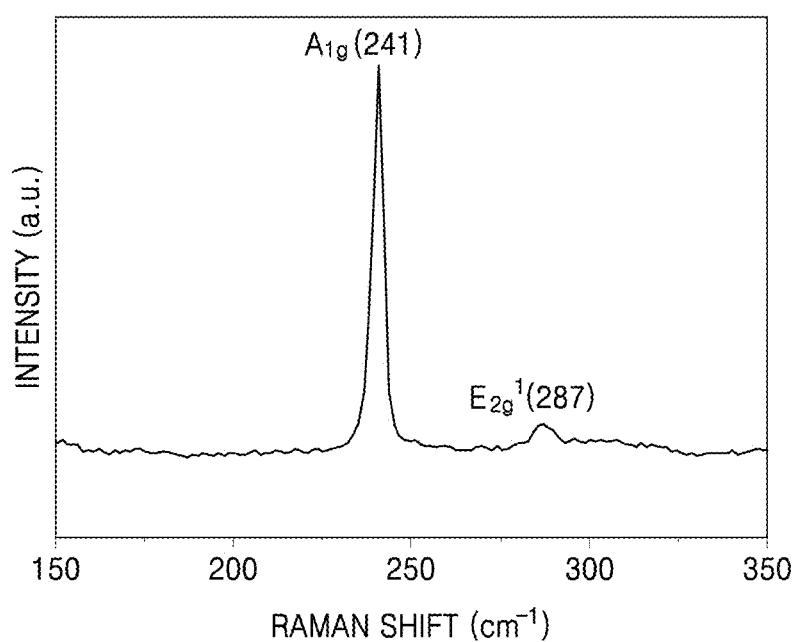

Referring to FIG. 4, an $E^1_{2g}$ mode peak and an $A_{1g}$ mode peak of the $MoS_2$ layer prepared in Example 1 appeared at Raman shifts, about 383 $cm^{-1}$ and about 404 $cm^{-1}$, respectively. Also, as shown in FIG. 5, an $A_{1g}$ mode peak and an $E_{2g}^1$ mode peak of the MoSe$_2$ layer prepared in Example 6 appeared at Raman shifts, about 241 cm$^{-1}$ and about 287 cm$^{-1}$, respectively. From these results, it may be confirmed that the MoS$_2$ layer prepared in Example 1 and the MoSe$_2$ layer prepared in Example 6 had a layered structure.

2) Example 3

Raman spectroscopy analysis was performed on the MoS$_2$ layer prepared in Example 3 in the same manner as in the Raman spectroscopy analysis performed on the MoS$_2$ layer prepared in Example 1 and the MoSe$_2$ layer prepared in Example 6.

Figure 10:
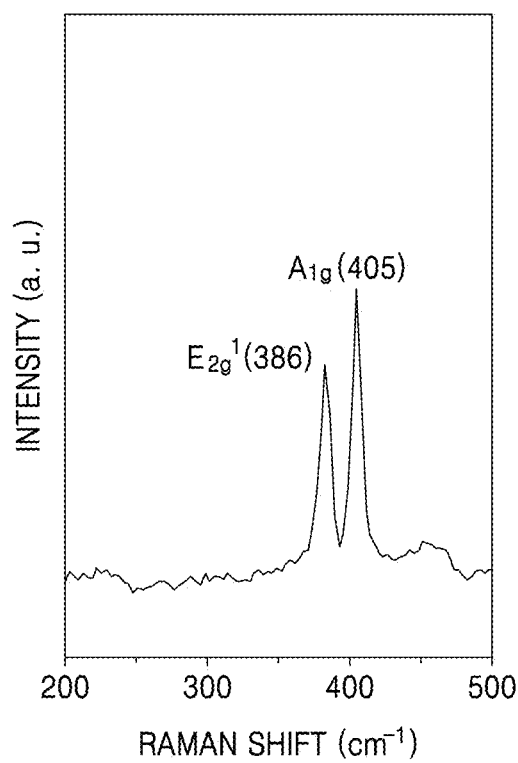
FIG. 10 illustrates the results of Raman spectroscopy analysis performed on the $MoS_2$ layer prepared in Example 3.

The results of the analysis are shown in FIG. 10.

Referring to FIG. 10, the MoS$_2$ layer prepared in Example 3 had an $E_{2g}^1$ mode peak and an $A_{1g}$ mode peak that were each respectively observed at Raman shifts about 386 cm$^{-1}$ and 405 cm$^{-1}$. In this regard, it may be known that the MoS$_2$ layer prepared in Example 3 has a layered structure.

EVALUATION EXAMPLE 2

Transmission Electron Microscopic Analysis

1) Example 6

A transmission electron microscopic analysis was performed on the MoS$_2$ layer prepared in Example 6.

Figure 6A:
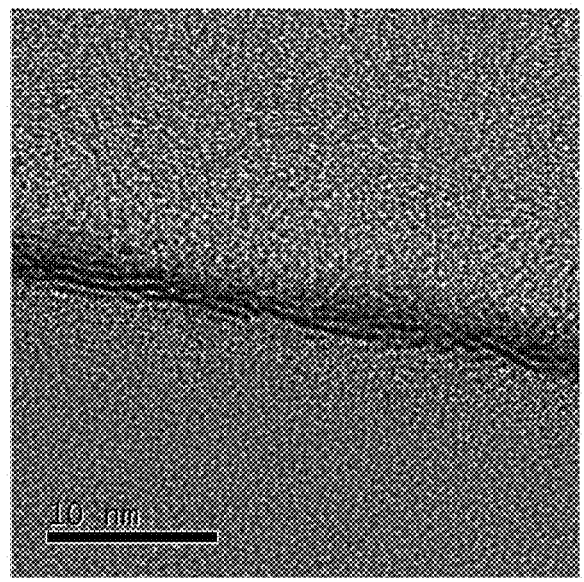
FIGS. 6A and 6B illustrate the results of optical microscope analysis performed on the $MoSe_2$ layer prepared in Example 6.
Figure 6B:
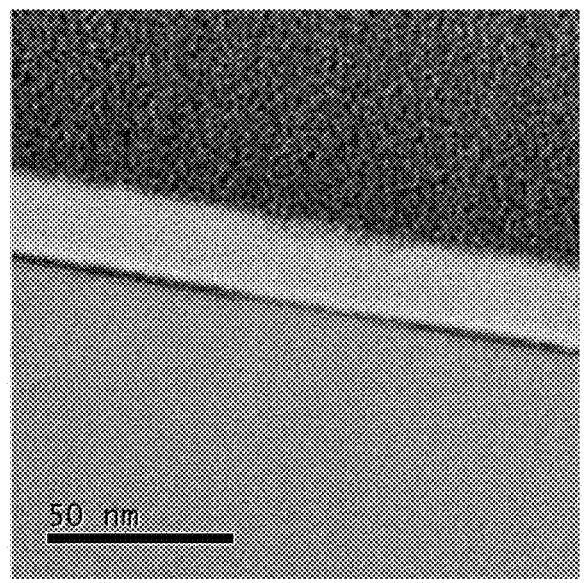

The analysis results are shown in FIGS. 6A and 6B.

Referring to FIGS. 6A and 6B, it may be confirmed that the MoSe$_2$ layer had a layered structure.

2) Example 3

Transmission electron microscope analysis was performed on the MoS$_2$ layer prepared in Example 3.

Figure 6C:
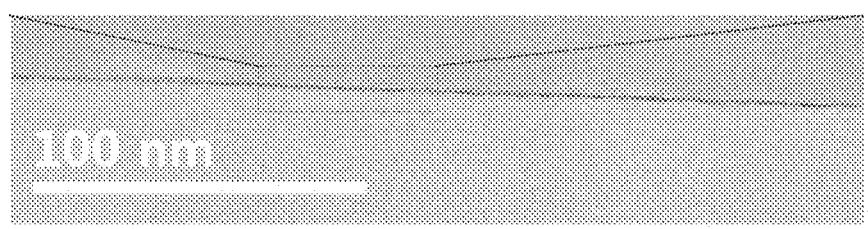
FIGS. 6C and 6D illustrate the results of transmission electron microscope analysis performed on the $MoS_2$ layer prepared in Example 3.
Figure 6D:

The results of the analysis are shown in FIGS. 6C and 6D. FIG. 6D is an enlarged view of a box in FIG. 6C.

Referring to FIGS. 6C and 6D, it may be confirmed that the MoS$_2$ layer has a layered structure.

EVALUATION EXAMPLE 3

Analysis Using a Cross-Sectional TEM (x-TEM) Equipped with an Energy Dispersive X-Ray Analyzer (EDX) (Also, Referred to as "x-TEM/EDX")

An x-TEM/EDX analysis was performed on the MoSe$_2$ layer prepared in Example 6.

Figure 7:
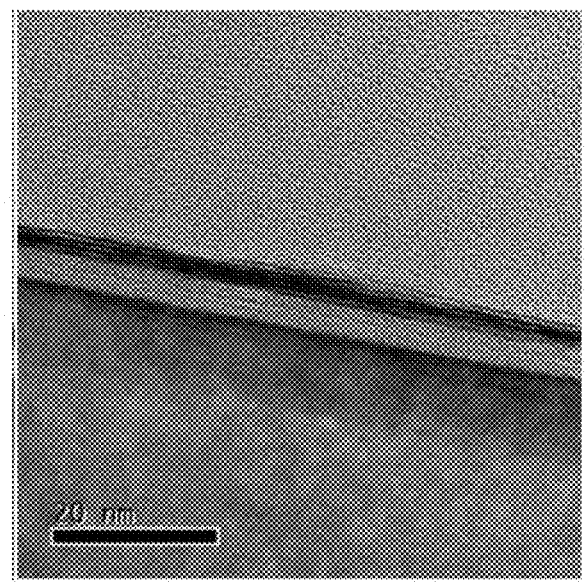
FIG. 7 illustrates the results of the TEM analysis performed on the $MoSe_2$ layer prepared in Example 6 by using an x-TEM (cross-sectional TEM)

The results of the TEM analysis are shown in FIG. 7.

Referring to FIG. 7, it may be confirmed that the MoSe$_2$ layer included Mo and Se and had a layered structure.

EVALUATION EXAMPLE 4

Figure 8A:
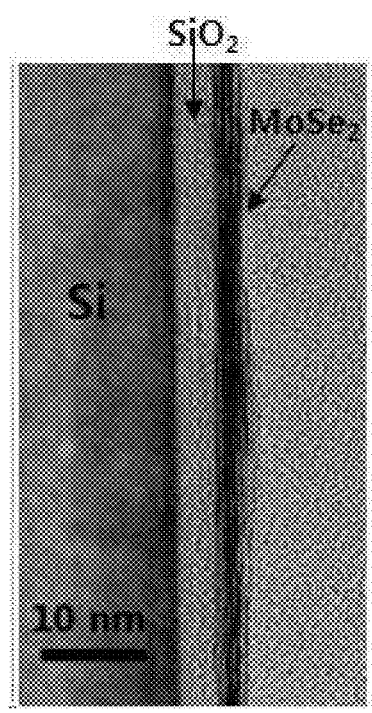
FIGS. 8A and 8B illustrate the results of transmission electron microscope (TEM)/energy dispersive spectroscopy (EDS) analysis and a high angle annular dark field scanning transmission electron microscope (HAADF-STEM) analysis performed on the $MoSe_2$ layer prepared in Example 6.
Figure 8B:
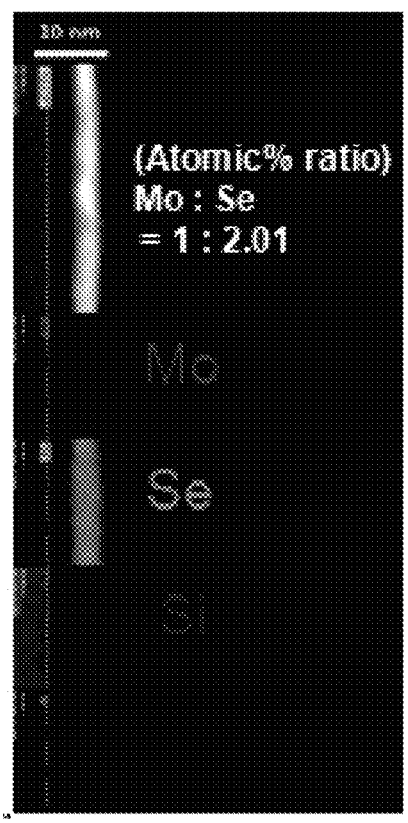

TEM/EDS Analysis and High-Angle Annular Dark Field Transmission Electron Microscopy (HAADF-STEM) Analysis A TEM/EDS analysis and a HAADF-STEM analysis were performed on the MoSe$_2$ layer prepared in Example 6, and the results are shown in FIGS. 8A and 8B.

FIG. 8A is an image of the MoSe$_2$ layer observed by TEM/EDS, and FIG. 8B is an image of the MoSe$_2$ layer observed by TEM-HAADF.

Referring to FIG. 8A, it may be confirmed that the MoSe$_2$ layer on the silicon oxide layer had a layered structure and was formed uniformly. Also, referring to FIG. 8B, it may be confirmed that an atom ratio of Mo and Se in the MoSe$_2$ layer formed on the silicon oxide layer was about 1:2.01.

Also, a TEM/EDS analysis and a HAADF-STEM analysis were performed on the MoS$_2$ layer prepared in Example 1.

Figure 8C:
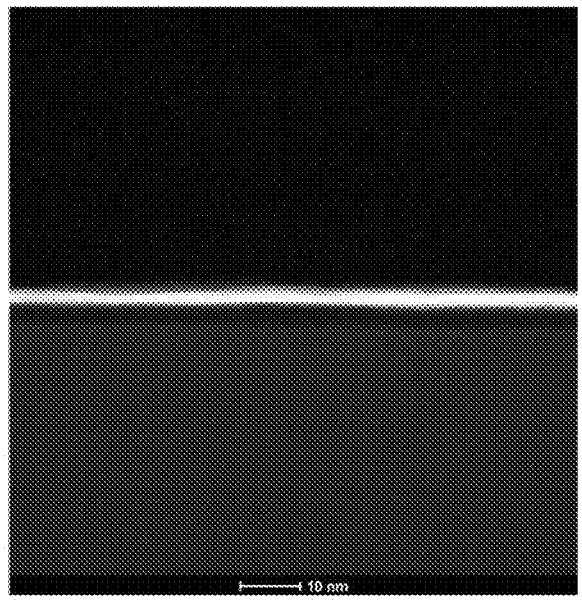
FIG. 8C illustrates the results of TEM/EDS analysis performed on the $MoS_2$ layer prepared in Example 1.

FIG. 8C is a TEM/EDS image of the MoS$_2$ layer. Also, as the results of analyzing the TEM/EDS image, it may be confirmed that an atom ratio of Mo and S was about 1:2.0.

EVALUATION EXAMPLE 5

Absorbance Analysis

The MoS$_2$ layer having a layered structure prepared in Example 1 and the MoS$_2$ layer having a layered structure prepared in Example 3 were grown to have the same thickness, and absorbance characteristics thereof were analyzed by using a deep ultraviolet (UV) ray having a wavelength of about 850 nm. An absorbance with respect to a silicon substrate was also measured for absorptivity difference comparison with those of the MoS$_2$ layer having a layered structure prepared in Example 1 and the MoS$_2$ layer having a layered structure prepared in Example 3. Here, the absorptivity analysis was performed by using SolidSpec-3700/3700DUV (available from Shimadzu) (http://www.s-si.shimadzu.com/products/product.cfm?product=solidspec).

Figure 9:
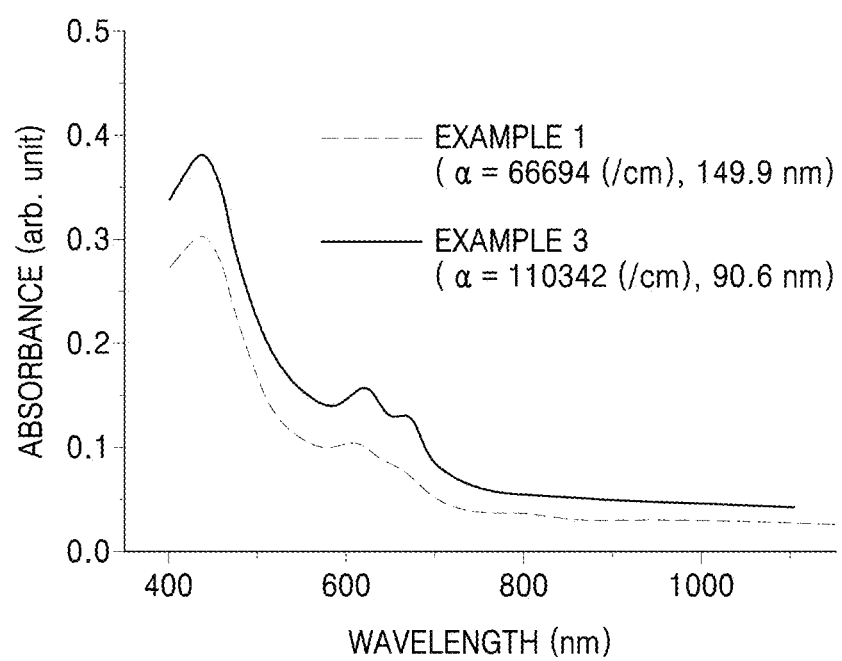
FIG. 9 illustrates the results of absorbance analysis performed on the $MoS_2$ layer having a layered structure as prepared in Example 1 and the $MoS_2$ layer having a layered structure as prepared in Example 3.

The results of the absorptivity analysis are as shown in Table 1 and FIG. 9.

TABLE 1

| | The number of layers | Absorption coefficient @ 850 nm [1/cm] | 70% absorption thickness* |
|---|---|---|---|
| Example 1 (MoS$_2$) | 7 | 66694 | 149.938 nm |
| Example 3 (MoS$_2$) | 7 | 110342 | 90.627 nm |
| Si | | 500 | ~20 μm |

*70% absorption thickness represents a thickness at which 70% of the irradiated deep UV ray is absorbed.

Referring to Table 1, it may be known that the MoS$_2$ layers prepared in Examples 1 and 3 had a decreased 70% absorption thickness compared to that of the Si layer. In this regard, it may be known that the MoS$_2$ layers prepared in Examples 1 and 3 have improved deep UV ray absorption characteristics.

As described above, according to example embodiments of inventive concepts, a layered transition metal chalcogenide compound layer may be obtained by using a method of preparing a layered transition metal chalcogenide compound layer, wherein the layered transition metal chalcogenide compound layer permits controlling thickness and the number of layers and has a high quality by improving a layer formation rate, differences in layer thicknesses, and layer composition reproducibility by performing chemical vapor deposition using a composition for a layered transition metal chalcogenide compound layer, wherein the composition includes a transition metal precursor and a chalcogenide precursor that may be deposited at a low temperature.

It should be understood that example embodiments described therein should be considered in a descriptive sense only and not for purposes of limitation. Descriptions of features or aspects within each composition and/or method according to example embodiments should typically be considered as available for other similar features or aspects in other compositions and/or methods according to example embodiments.

While some example embodiments have been particularly shown and described, it will be understood by one of ordinary skill in the art that variations in form and detail may be made therein without departing from the spirit and scope of the claims.

What is claimed is:

1. A composition for forming a layered transition metal chalcogenide compound layer, the composition comprising:
  i) at least one selected from a transition metal precursor represented by Formula 1 and a transition metal precursor represented by Formula 1d, $$M_a(R_1)_{6-b-c}(H)_b(R_2)_c,\quad\text{[Formula 1]}$$

wherein, in the above Formula 1,
  M is a transition metal,
  $R_1$ is one of a hydrogen atom; a C1-C10 alkyl group; a C2-C10 alkenyl group; a halogen; a C6-C10 aryl group; a C5-C10 cycloalkyl group; a C5-C10 cycloalkenyl group; (C=O)R, where, R is one of a hydrogen atom and a C1-C10 alkyl group; a C1-C10 alkoxy group; a C1-C10 amidinate group; a C1-C10 amidino group; a C1-C10 alkylamide group; a C1-C10 alkylimide group; —N(R)(R'), where, R and R' are each independently one of a C1-C10 alkyl group and a hydrogen atom; R(C=O)CN, where, R is one of a hydrogen atom and a C1-C10 alkyl group; and a C1-C10 β-diketonate group,
  $R_2$ is one of a hydrogen atom; a C1-C10 alkyl group; a C2-C10 alkenyl group; a carbonyl group (C=O); a halogen; a C6-C10 aryl group; a C5-C10 cycloalkyl group; a C5-C10 cycloalkenyl group; (C=O)R, where, R is one of a hydrogen atom and a C1-C10 alkyl group; a C1-C10 alkoxy group; a C1-C10 amidinate group; a C1-C10 amidino group; a C1-C10 alkylamide group; a C1-C10 alkylimide group; —N(R)(R'), where, R and R' are each independently one of a C1-C10 alkyl group and a hydrogen atom; R(C=O)CN, where, R is one of a hydrogen atom and a C1-C10 alkyl group; and a C1-C10 β-diketonate group,
  a is 1 or 2,
  b is an integer of 0 to 3,
  c is an integer of 0 to 3, and
  at least one of $R_1$ and $R_2$ is not a hydrogen atom;

$$M(R_1)_d\quad\text{[Formula 1d]}$$

wherein, in Formula 1d, M is a transition metal,
  $R_1$ is a hydrogen atom; a C1-C10 alkyl group; a C2-C10 alkenyl group; a carbonyl group (C=O); a halide; a C6-C10 aryl group; a C5-C10 cycloalkyl group; a C6-C10 cycloalkenyl group; (C—O)R, where, R is a hydrogen atom or a C1-C10 alkyl group; a C1-C10 alkoxy group; a C1-C10 amidinate group; a C1-C10 alkylamide group; a C1-C10 alkylimide group; —N(R)(R'), where, R and R' are each independently a C1-C10 alkyl group or a hydrogen atom; R(C=O)CN, where, R is a hydrogen atom or a C1-C10 alkyl group; or a C1-C10 β-diketonate group,
  d is 3 or 4, and
  ii) a chalcogenide precursor represented by Formula 2, $$M'_kX_2,\quad\text{[Formula 2]}$$

wherein, in the above Formula 2,
  M' is a chalcogenide element,
  each X is independently one of a hydrogen atom; a C1-C10 alkyl group; a C2-C10 alkenyl group; a carbonyl group (C=O); a halogen; a C6-C10 aryl group; a C5-C10 cycloalkyl group; a C5-C10 cycloalkenyl group; (C=O)R, where, R is one of a hydrogen atom and a C1-C10 alkyl group; a C1-C10 alkoxy group; a C1-C10 amidinate group; a C1-C10 alkylamide group; a C1-C10 alkylimide group; —N(R)(R'), where, R and R' are each independently one of a C1-C10 alkyl group and a hydrogen atom; R(C=O)CN, where, R is one of a hydrogen atom and a C1-C10 alkyl group; and a C1-C10 β-diketonate group,
  k is 1 or 2,
  and at least one X among $X_2$ is not a hydrogen atom.

2. The composition of claim 1, wherein the transition metal precursor represented by Formula 1 and the chalcogenide precursor represented by Formula 2 have a partial vapor pressure of 0.1 Torr or higher at a temperature of about 350° C. or lower.

3. The composition of claim 1, wherein the transition metal is one of tungsten (W), molybdenum (Mo), zirconium (Zr), tantalum (Ta), hafnium (Hf), niobium (Nb), platinum (Pt), cobalt (Co), nickel (Ni), chrome (Cr), vanadium (V), palladium (Pd), gold (Au), rhenium (Re), yttrium (Y), technetium (Tc), and titanium (Ti).

4. The composition of claim 1, wherein the transition metal precursor is represented by one of Formulae 1a to 1c:

$$M(R_3)_6\quad\text{[Formula 1a]}$$

$$M(R_4)_3,\ \text{and}\quad\text{[Formula 1b]}$$

$$M(R_4)_4,\quad\text{[Formula 1c]}$$

wherein, in the above Formulae 1a to 1c,
  M is one of tungsten (W) and molybdenum (Mo),
  each $R_3$ is independently one of a propylcyclopentadienyl group, a bicyclo[2.2.1]hepta-2,5-diene group, a cycloheptatriene group, and an acetonitrile group, and
  each $R_4$ is independently one of a carbonyl group (CO), a propylcyclopentadienyl group, a bicyclo[2.2.1]hepta-2,5-diene group, a cycloheptatriene group, and an acetonitrile group.

5. The composition of claim 1, wherein the chalcogenide precursor is represented by Formula 2a:

$$M'_kX_2\quad\text{[Formula 2a]}$$

wherein, in Formula 2a, M' is one of sulfur (S) and tellurium (Te),
  X is a C1-C10 alkyl group, and
  k is 1 or 2.

6. The composition of claim 1, wherein the transition metal precursor is at least one of (bicycle [2.2.1]hepta-2,5-diene)tetracarbonyl molybdenum(0), cyclopentadienylmolybdenum(II) tricarbonyl dimer, (propylcyclopentadienyl) molybdenum(I) tricarbonyl dimer, tricarbonyl (cycloheptatriene) molybdenum(0), tris(acetonitrile) tricarbonyl molybdenum(0), tungsten hexacarbonyl, bis(isopropylcyclopentadienyl)tungsten(IV) dihydride, cyclopentadienyltungsten(II) tricarbonyl hydride, bis(tert-butylimino)bis(dimethylamino)tungsten(VI), tetracarbonyl(1,3-cyclohexadiene)tungsten, and tetracarbonyl(1,5-cyclooctadiene)tungsten(0).

7. The composition of claim 1, wherein the chalcogenide precursor is at least one of dimethyl sulfide, diethyl sulfide, di-tert-butyl sulfide, dimethyl disulfide, diethyl disulfide, di-tert-butyl disulfide, tert-butyl thiol, dimethyl selenide, diethyl diselenide, diisopropyl selenide, and di-tert-butyl selenide.

8. The composition of claim 1, wherein
  the transition metal precursor and the chalcogenide precursor are provided in a carrier gas, and
  a mixing volume ratio of the transition metal precursor and the chalcogenide precursor is in a range of about 1:1 to about 1:1500.

9. A composition comprising:
one of a transition metal precursor represented by Formula 1 and a chalcogenide precursor represented by Formula 2 or Formula 3, $$M_a(R_1)_{6-b-c}(H)_b(R_2)_c \quad \text{[Formula 1]}$$

$$M'_k X_2 \quad \text{[Formula 2]}$$

$$M''_k X'_2 \quad \text{[Formula 3]}$$

wherein, in the above Formulas 1, 2, and 3,
M is a transition metal,
M' is sulfur (S),
M'' is a chalcogenide element that is different than sulfur (S),
$R_1$ is one of a hydrogen atom; a C1-C10 alkyl group; a C2-C10 alkenyl group; a halogen; a C6-C10 aryl group; a C5-C10 cycloalkyl group; a C5-C10 cycloalkenyl group; (C=O)R, where, R is one of a hydrogen atom and a C1-C10 alkyl group; a C1-C10 alkoxy group; a C1-C10 amidinate group; a C1-C10 amidino group; a C1-C10 alkylamide group; a C1-C10 alkylimide group; —N(R)(R'), where, R and R' are each independently one of a C1-C10 alkyl group and a hydrogen atom; R(C=O)CN, where, R is one of a hydrogen atom and a C1-C10 alkyl group; and a C1-C10 β-diketonate group,
$R_2$ is one of a hydrogen atom; a C1-C10 alkyl group; a C2-C10 alkenyl group; a carbonyl group (C=O); a halogen; a C6-C10 aryl group; a C5-C10 cycloalkyl group; a C5-C10 cycloalkenyl group; (C=O)R, where, R is one of a hydrogen atom and a C1-C10 alkyl group; a C1-C10 alkoxy group; a C1-C10 amidinate group; a C1-C10 amidino group; a C1-C10 alkylamide group; a C1-C10 alkylimide group; —N(R)(R'), where, R and R' are each independently one of a C1-C10 alkyl group and a hydrogen atom; R(C=O)CN, where, R is one of a hydrogen atom and a C1-C10 alkyl group; and a C1-C10 β-diketonate group,
X is one of a hydrogen atom; C2-C10 alkenyl group; a carbonyl group (C=O); a C6-C10 aryl group; a C5-C10 cycloalkenyl group; (C=O)R, where, R is one of a hydrogen atom and a C1-C10 alkyl group; a C1-C10 alkoxy group; a C1-C10 amidinate group; a C1-C10 amidino group; a C1-C10 alkylamide group; a C1-C10 alkylimide group; —N(R)(R'), where, R and R' are each independently one of a C1-C10 alkyl group and a hydrogen atom; R(C=O)CN, where, R is one of a hydrogen atom and a C1-C10 alkyl group; and a C1-C10 β-diketonate group, and
X' is one of a hydrogen atom; a C1-C10 alkyl group; a C2-C10 alkenyl group; a carbonyl group (C=O); a halogen; a C6-C10 aryl group; a C5-C10 cycloalkyl group; a C5-C10 cycloalkenyl group; (C=O)R, where, R is one of a hydrogen atom and a C1-C10 alkyl group; a C1-C10 alkoxy group; a C1-C10 alkylimide group; —N(R)(R'), where, R and R' are each independently one of a C1-C10 alkyl group and a hydrogen atom; R(C=O)CN, where, R is one of a hydrogen atom and a C1-C10 alkyl group; and a C1-C10 β-diketonate group,
a is 1 or 2,
b is an integer of 0 to 3,
c is an integer of 0 to 3,
k is 1 or 2,
at least one of $R_1$ and $R_2$ is not a hydrogen atom, and
at least one X among $X_2$ is not a hydrogen atom.

10. The composition of claim 9, wherein
the one of the transition metal precursor and the chalcogenide precursor is the transition metal precursor.
11. The composition of claim 10, wherein the transition metal is one of tungsten (W), molybdenum (Mo), zirconium (Zr), tantalum (Ta), hafnium (Hf), niobium (Nb), platinum (FL), cobalt (Co), nickel (Ni), chrome (Cr), vanadium (V), palladium (Pd), gold (Au), rhenium (Re), yttrium (Y), technetium (Tc), and titanium (Ti).
12. The composition of claim 10, wherein the transition metal precursor is represented by one of Formulae 1a to 1c:

$$M(R_3)_6 \quad \text{[Formula 1a]}$$

$$M(R_4)_3, \text{and} \quad \text{[Formula 1b]}$$

$$M(R_4)_4, \text{wherein, in the above Formulae 1a to 1c,} \quad \text{[Formula 1c]}$$

M is one of tungsten (W) and molybdenum (Mo),
$R_3$ is one of a propylcyclopentadienyl group, a bicyclo[2.2.1]hepta-2,5-diene group, a cycloheptatriene group, and an acetonitrile group, and
$R_4$ is one of a carbonyl group (CO), a propylcyclopentadienyl group, a bicyclo[2.2.1]hepta-2,5-diene group, a cycloheptatriene group, and an acetonitrile group.
13. The composition of claim 9, wherein
the one of the transition metal precursor and the chalcogenide precursor is the chalcogenide precursor.
14. The composition of claim 13, wherein the chalcogenide precursor is represented by Formula 3a:

$$M''_k X'_2 \quad \text{[Formula 3a]}$$

wherein, in Formula 3a, M'' is tellurium (Te),
X' is a C1-C10 alkyl group, and
k is 1 or 2.
15. The composition of claim 13, wherein the chalcogenide precursor is at least one of tert-butyl thiol, dimethyl selenide, diethyl diselenide, diisopropyl selenide, and di-tert-butyl selenide.
16. A method of preparing a layered transition metal chalcogenide compound layer, the method comprising:
loading a substrate into a reactor;
independently providing the composition of claim 9 and an other of the transition metal precursor and the chalcogenide precursor in a gaseous state on the substrate loaded into the reactor; and
performing chemical vapor deposition (CVD) by contacting the transition metal precursor and the chalcogenide precursor with the substrate.
17. The method of claim 16, wherein the performing chemical vapor deposition is performed at a reactor temperature in a range of about 550° C. to about 950° C.
18. The method of claim 16, further comprising:
performing a heat-treatment on the substrate after performing the CVD.
19. The method of claim 16, wherein the independently providing the composition and an other of the transition metal precursor and the chalcogenide precursor includes:
storing the transition metal precursor and the chalcogenide precursor in containers that are independent from each other; and
supplying the transition metal precursor and the chalcogenide precursor from the containers to the reactor through independent injection lines.
20. A layered transition metal chalcogenide compound layer obtained by the method of claim 16.
21. The composition of claim 3, wherein
the transition metal is molybdenum (Mo), and
the chalcogenide element is sulfur (S).

* * * * *